United States Patent [19]
Brillouet et al.

[11] Patent Number: 5,747,366
[45] Date of Patent: May 5, 1998

[54] METHOD OF FABRICATING A SURFACE EMITTING SEMICONDUCTOR LASER

[75] Inventors: François Brillouet, Clamart; Léon Goldstein, Chaville; Joël Jacquet, Limours; Antonina Plais, Paris; Paul Salet, Clamart, all of France

[73] Assignee: Alcatel Alsthom Compagnie Generale D'Electricite, Paris Cedex, France

[21] Appl. No.: 773,355

[22] Filed: Dec. 26, 1996

[30] Foreign Application Priority Data

Dec. 27, 1995 [FR] France .................................. 95 15544

[51] Int. Cl.⁶ ............................. H01L 21/00; H01S 3/19
[52] U.S. Cl. .................................. 438/44; 372/46
[58] Field of Search .............................. 437/129; 372/46; 438/29, 42, 44

[56] References Cited

U.S. PATENT DOCUMENTS

| | | | |
|---|---|---|---|
| 5,038,356 | 8/1991 | Botez et al. | 437/129 |
| 5,241,554 | 8/1993 | Iga et al. | 372/46 |
| 5,266,503 | 11/1993 | Wang et al. | 437/24 |
| 5,390,210 | 2/1995 | Fouquet et al. | 437/129 |
| 5,400,354 | 3/1995 | Ludowise et al. | 372/46 |
| 5,493,577 | 2/1996 | Choquette et al. | 372/46 |
| 5,517,039 | 5/1996 | Holonyak, Jr. et al. | 372/46 |
| 5,581,571 | 12/1996 | Holonyak, Jr. et al. | 372/46 |
| 5,594,751 | 1/1997 | Scott | 372/46 |
| 5,696,784 | 12/1997 | Srinivasan et al. | 372/46 |

OTHER PUBLICATIONS

D. L. Huffaker et al, "Native-Oxide Defined Ring Contact for Low Threshold Vertical-Cavity Lasers", *Applied Physics Letters*, vol. 65, No. 1, 4 Jul. 1994, pp. 97–99.

G. S. Li et al, "Polarisation and Modal Behaviour of Low Threshold Oxide and Airgap Confined Vertical Cavity Lasers", *Electronics Letters*, vol. 31, No. 23, 9 Nov. 1995, pp. 2014–2015.

S. Rochus et al, "Vertical Cavity Surface–Emitting Lasers with Buried Lateral Current Confinement", *Compound Semiconductors 1994*, San Diego, Sep. 18–22, 1994, No. Proc. 21, 18 Sep. 1994, pp. 563–566.

G. M. Yang et al, "Ultralow Threshold Current Vertical-Cavity Surface-Emitting Lasers Obtained with Selective Oxidation", *Electronics Letters*, vol. 31, No. 11, 25 May 1995, pp. 886–888.

*Primary Examiner*—Brian Dutton
*Attorney, Agent, or Firm*—Sughrue, Mion, Zinn, Macpeak & Seas, PLLC

[57] ABSTRACT

In a method of fabricating a surface emitting semiconductor layer, to achieve good electrical confinement and good flatness of the mirrors delimiting the resonant cavity of the laser, an electrical confinement layer is made by growing a localized aluminum alloy layer on the active layer, except for an opening area on top of which the mirror is to be formed. After epitaxial regrowth, the alloy layer is oxidized laterally. Applications include the fabrication of semiconductor lasers on III-V substrates such as InP and GaAs.

7 Claims, 2 Drawing Sheets

METHOD OF FABRICATING A SURFACE EMITTING SEMICONDUCTOR LASER

BACKGROUND OF THE INVENTION

1. Field of the Invention

The invention concerns a class of semiconductor lasers known as Vertical Cavity Surface Emitting Lasers (VCSEL).

2. Description of the Prior Art

These lasers are fabricated on a semiconductor substrate made of type III-V elements such as gallium arsenide GaAs or indium phosphide InP.

Unlike conventional semiconductor lasers, the light is emitted perpendicularly to the surface of the active layer and in the same direction as that in which the electrical current sustaining the laser effect is injected. The component essentially comprises a resonant cavity containing the active layer and delimited by two opposed semiconductor or dielectric mirrors. In the case of an InP substrate, for example, the resonant cavity is formed of a p-doped InP layer, an active layer and a n-doped InP layer. The current is injected via two electrodes on respective opposite sides of the resonant cavity. At least one of these electrodes is generally placed alongside or more usually around the mirror on the same face. Good efficiency of a structure of this kind is conditioned by sufficient confinement of the active layer from the optical and electrical points of view.

To obtain good electrical and optical confinement, a first solution is to use a structure in which the active layer is buried in a medium having a lower refractive index. If the good conductor active layer is additionally buried in a p-doped medium at the boundary of the n medium, electrical confinement is also obtained because of the threshold voltage of the p-n junction surrounding the active layer. Obtaining this structure requires lateral etching to form a relatively high mesa containing the part of the active layer that is to be buried. Several stages of epitaxial regrowth of n-doped and then p-doped substrate are then required. Apart from its complexity, this solution has the drawback of a lack of flatness above the mesa, i.e. at the location where one of the mirrors must be formed.

Another solution is to etch a mesa sufficiently high to expose laterally the periphery of the active layer. Lateral etching of this active layer then produces the required confinement. This solution solves the problem of the flatness of the surface but introduces the problem of recombination of carriers in the vicinity of the interface between the active layer and the air.

Another solution is described in the article "Ultralow threshold current vertical-cavity surface-emitting lasers obtained with selective oxidation", G.M. Yang, et al, ELECTRONICS LETTERS, 25 May 1995, Vol.31, No.11. The proposed structure includes an active layer that is not buried on top of which a current confinement layer is placed. This layer is a continuous layer of aluminum arsenide which is subjected to controlled lateral oxidation to leave a current opening below the top mirror. This solution achieves good flatness of the surface receiving the mirror but requires delicate control of the lateral oxidation step. Moreover, it is then necessary to deposit a silicon nitride protective layer to stop oxidation of the aluminum arsenide layer.

One aim of the invention it to avoid the drawbacks of the above solutions by proposing a method that is easy to use and applicable regardless of the composition of the substrate.

SUMMARY OF THE INVENTION

To this end, the invention consists in a method of fabricating a surface emitting semiconductor laser formed on a III-V element substrate, said laser including a resonant cavity delimited by mirrors and containing an active layer and an electrical confinement layer, in which method the formation of said electrical confinement layer comprises the following steps:

growing a localized aluminum alloy layer on top of said active layer except for an opening area on top of which one of said mirrors is to be formed, at least one step of epitaxial regrowth of doped substrate, and lateral oxidation of said localized aluminum alloy layer.

The lateral oxidation is advantageously preceded by a lateral etching step to expose the periphery of said aluminum alloy layer.

In one embodiment, the aluminum alloy is aluminum arsenide AlAs the oxide of which has the advantage of being both electrically insulative and a good conductor of heat. Further, in the case of a gallium arsenide substrate, an appropriate choice of the composition of the aluminum arsenide alloy provides a lattice match to the substrate, which facilitates subsequent epitaxial regrowth. Using the method of the invention, when the substrate is indium phosphide, it is also possible to use gallium arsenide which is mismatched to InP. With this substrate, aluminum antimony arsenide AlAsSb can also be used as the alloy, with a composition matching the lattice of the indium phosphide.

Other features of the invention will emerge from the remainder of the description with reference to the accompanying drawings.

DETAILED DESCRIPTION OF THE PREFERRED EMBODIMENT

The fabrication steps are described in the specific case of an InP substrate. However, the method may be applied to any other substrate made from III-V elements such as GaAs.

Figure 1:
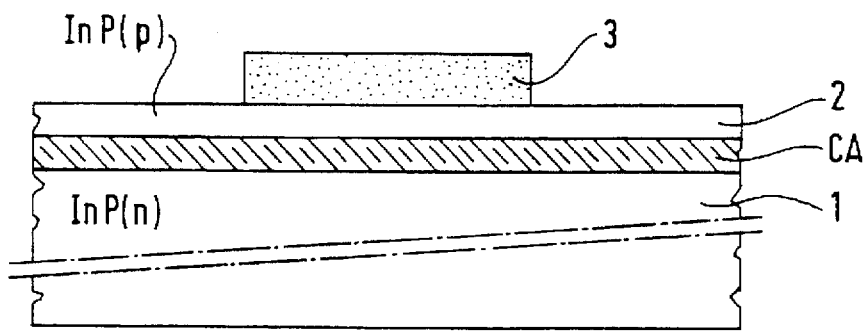
FIGS. 1 through 6 show the principal steps of the method of the invention.

As shown in FIG. 1, an active layer CA is deposited on a n-doped indium phosphide substrate 1. The active layer CA is covered with a top layer of p-doped indium phosphide the thickness of which defines the distance between the active layer and the electrical confinement layer. A mask 3 made of silica, for example, is deposited on the top layer 2. The position and the dimensions of the mask 3 correspond to those of the opening to be provided in the electrical confinement layer.

Figure 2:
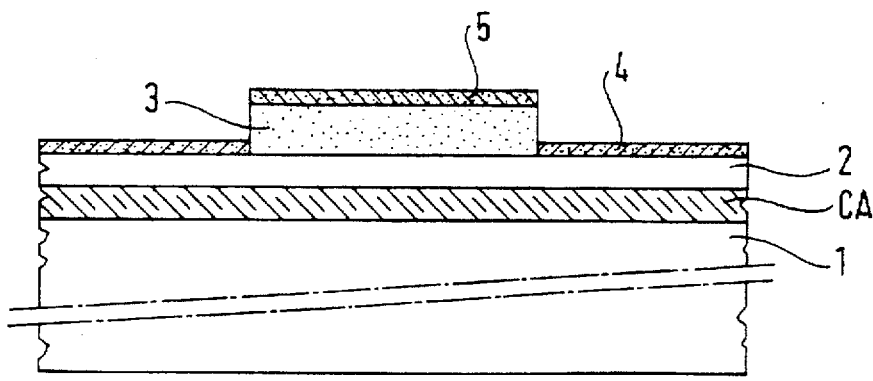

As shown in FIG. 2, an aluminum alloy layer 4, 5 is then deposited on the surface of the component. This layer may be deposited by the molecular beam method or by metalorganic chemical vapor deposition (MOCVD). In the latter case the aluminum alloy layer is localized to the InP areas.

Figure 3:
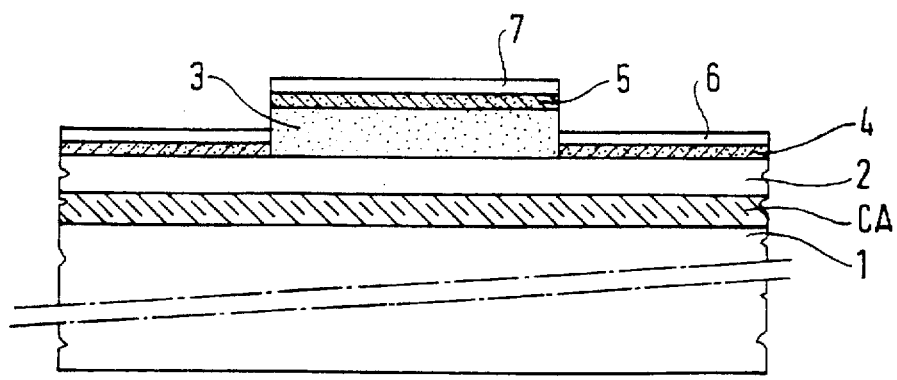

Referring to FIG. 3, a thin layer 6, 7 of p-doped indium phosphide is then deposited to provide a transition area in the event that the aluminum alloy lattice does not match that of the substrate.

Figure 4:
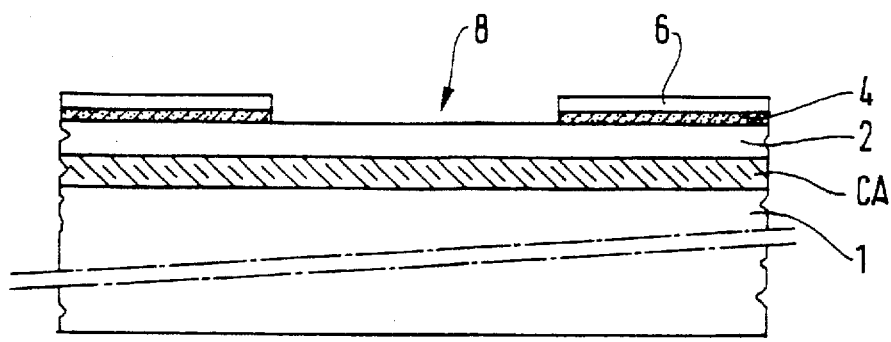

The mask 3 is then wet etched. In the case of a silica mask, an etch solution based on hydrofluoric acid is used. The effect of this operation is to expose an opening area 8 that can be seen in FIG. 4.

Figure 5:
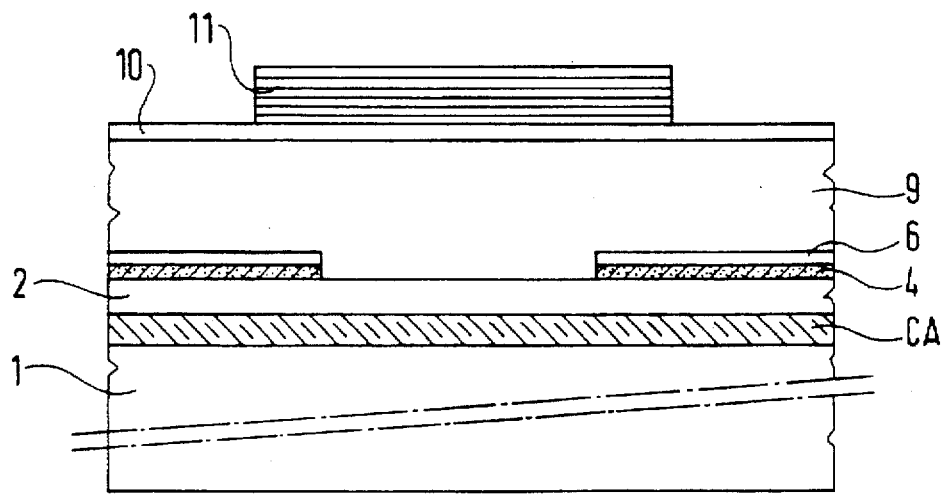

The method continues with a step of epitaxial regrowth of p-doped indium phosphide to form a top confinement layer 9 and then of the InGaAs substance to form a contact layer 10 (FIG. 5). Although the molecular beam epitaxy method may be used, the metalorganic chemical vapor deposition (MOCVD) method gives better results from the point of view of the flatness of the layers formed. The semiconductor or dielectric top mirror 11 is then formed.

Figure 6:
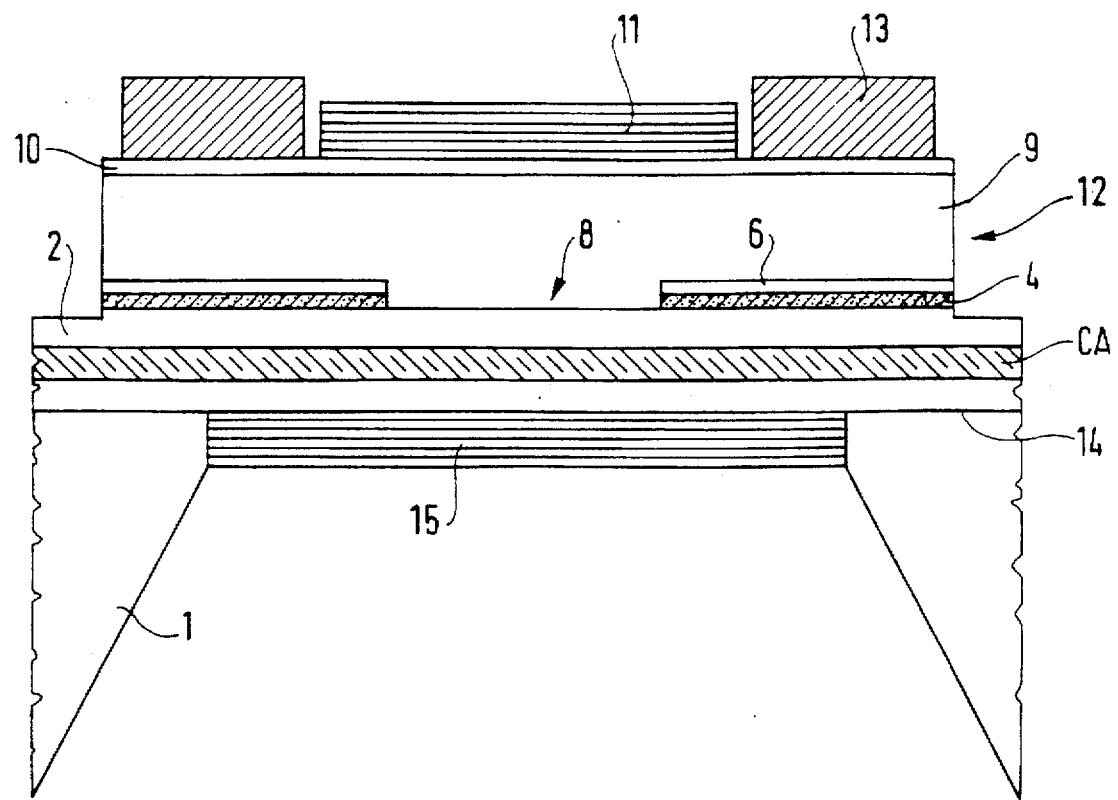

As shown in FIG. 6, the top part of the component is then etched laterally to form a mesa 12. The etch depth is sufficient to expose the periphery of the aluminum alloy layer 4 and so facilitate its oxidation. This layer is then laterally oxidized to confer upon it its electrical insulation property. To complete the fabrication of the component the bottom part of the InP substrate is then etched as far as an etch stop layer 14, the bottom mirror 15 is formed and the electrodes 13 are applied.

Given the shallow depth of the opening 8, the deficient flatness of the latter layers 9, 10 receiving the mirror 11 can be deemed to be negligible. Moreover stresses in the layer 9 in the vicinity of the oxide layer 4 have little effect on operation of the device, which is essentially conditioned by the crystallographic quality of the central part of the device.

Finally, a few representative dimensions are given by way of illustration only:

thickness of active layer CA: 0.7 μm thickness of layer 4 :0.2–0.3 μm distance between layers CA and 4:1 μm diameter of opening 8: 8 μm diameter of mirror 10: 12–16 μm diameter of mesa 11: 30 μm The active layer is made of InGaAsP alloy with a composition depending on the wavelength of the laser, which is 1.3 μm or 1.55 μm, for example.

There is claimed:

1. A method of fabricating a surface emitting semiconductor laser formed on a first doped III–V element substrate, said laser including a resonant cavity delimited by mirrors and containing an active layer and an electrical confinement layer, in said method the formation of said electrical confinement layer comprises the following steps:

growing a localized aluminum alloy layer above said active layer so that an opening area is provided on top of which one of said mirrors is to be formed, performing at least one step of epitaxial regrowth of a second doped III–V element substrate, and performing lateral oxidation of said localized aluminum alloy layer.

2. The method claimed in claim 1 wherein said step of lateral oxidation is preceded by a lateral etching step to expose the periphery of said aluminum alloy layer.

3. The method claimed in claim 1 wherein said aluminum alloy layer is aluminum arsenide.

4. The method claimed in claim 1 wherein said laser is formed on an indium phosphide substrate and said aluminum alloy is aluminum antimony arsenide with a composition having a lattice matched to said indium phosphide substrate.

5. The method claimed in claim 1 wherein the step of growing said localized aluminum alloy layer further comprises the following steps:

depositing above said active layer a mask in a position corresponding to said opening area said mask having the same dimensions as said opening area;

growing said localized aluminum alloy layer, and selectively etching said mask.

6. The method claimed in claim 5 wherein said step of epitaxial regrowth is effected by the metalorganic chemical vapor deposition process.

7. The method claimed in claim 5 wherein said step of selectively etching is preceded by a step of depositing a layer of said second doped II–V element substrate.

* * * * *